United States Patent [19]
Szlufcik et al.

[11] Patent Number: 5,726,065
[45] Date of Patent: Mar. 10, 1998

[54] METHOD OF PREPARING SOLAR CELL FRONT CONTACTS

[75] Inventors: Jozef Szlufcik, Kessel-Lo; Johan Nijs, Linden-Lubbeek; Roland Jozef Fick, Oud-Turnhout, all of Belgium

[73] Assignee: IMEC VZW, Leuven, Belgium

[21] Appl. No.: 604,666

[22] Filed: Feb. 21, 1996

[30] Foreign Application Priority Data

Feb. 21, 1995 [EP] European Pat. Off. ............ 95870012
Dec. 22, 1995 [EP] European Pat. Off. ............ 95870135

[51] Int. Cl.$^6$ .................................................. H01L 31/18
[52] U.S. Cl. .................... 437/2; 437/180; 437/181; 437/195; 136/256
[58] Field of Search ............... 437/2–5, 180–181, 437/189, 195; 136/256

[56] References Cited

U.S. PATENT DOCUMENTS

| | | | |
|---|---|---|---|
| 3,922,774 | 12/1975 | Lindmayer et al. | 437/2 |
| 4,602,120 | 7/1986 | Wakefield et al. | 136/256 |
| 5,279,682 | 1/1994 | Wald et al. | 136/256 |

FOREIGN PATENT DOCUMENTS

| | | | |
|---|---|---|---|
| 0002550 | 6/1979 | European Pat. Off. | 136/256 |
| 62-156881 | 7/1987 | Japan | 136/256 |
| WO92/22928 | 12/1992 | WIPO | 136/256 |

OTHER PUBLICATIONS

I.R. Lawrence, *Conference Record, 14th IEEE PVSC* (1980), pp. 541–544.

K.F. Teng et al, *Conference Record, 19th IEEE PVSC* (1987), pp. 1430–1434.

Sabo, et al., "Silver Thick Film Metallization for Photovoltaics Fired at 300°C", Proceedings 1985 International Symposium on Microelectronics, pp. 59–66, Nov. 11, 1985.

Nakatani, et al., "A New Process for High Efficiency Silicon Solar Cells", 17th IEEE Photovoltaic Specialists Conference, pp. 1352–1356, May 1, 1984.

Nunoi, et al., "High Performance BSF Silicon Solar Cell With Fire Through Contacts Printed on AR Coating", 14th IEEE Photovoltaic Specialists Conference, pp. 805–810, Jan. 7, 1980.

*Primary Examiner*—Aaron Weisstuch
*Attorney, Agent, or Firm*—Knobbe, Martens, Olson & Bear, LLP

[57] ABSTRACT

Method of preparing on a solar cell the top contact pattern which consists of a set of parallel narrow finger lines and wide collector lines deposited essentially at right angles to the finger lines on the semiconductor substrate, characterized in that it comprises at least the following steps:

(a) screen printing and drying the set of contact finger lines;
(b) printing and drying the wide collector lines on the top of the set of finger lines in a subsequent step;
(c) firing both finger lines and collector lines in a single final step in order to form an ohmic contact between the finger lines and the semiconductor substrate and between the finger lines and the wide collector lines.

13 Claims, 3 Drawing Sheets

METHOD OF PREPARING SOLAR CELL FRONT CONTACTS

OBJECT OF THE INVENTION

The present invention is related to a method of preparing contacts on the surface of semiconductor substrates. The present invention is also related to products obtained by this method and more particularly to a solar cell.

STATE OF THE ART

Conventional screen printing is currently used in a mass scale production of solar cells. Typically, the top contact pattern of a solar cell consists of a set of parallel narrow finger lines and wide collector lines deposited essentially at a right angle to the finger lines on the semiconductor substrate or wafer.

Such front contact formation of crystalline solar cells is performed with standard screen printing techniques. It has advantages in terms of production simplicity, automation, and low production cost.

Low series resistance and low metal coverage (low front surface shadowing) are basic requirements for the front surface metallization.

According to the document Hybrid Circuit No. 30, January 1993, "Thick-film Fine-line Fabrication Technique—Application to Front Metallization of Solar Cells," by A. Dziedzic, J. Nijs, and J. Szlufcik, minimum metallization widths of 100–150 μm are obtained using conventional screen printing. This causes a relatively high shading of the front solar cell surface. In order to decrease the shading a large distance between the contact lines, i.e., 2 to 3 mm is required. On the other hand, this implies the use of a highly doped, conductive emitter layer. However, the heavy emitter doping induces a poor response of the solar cell to short wavelength light. Narrower conductive lines can be printed using ultra-thin stainless steel wire screens with a high mesh density of 325 or 400. A thin masking emulsion with a thickness of 5–15 μm is required to produce a line definition on the screen of at least 50 vm.

Although a line width of 50 μm can be achieved, the line thickness decreases below 10 μm measured after the firing process. This gives rise to increased line resistance causing high power dissipation, particularly in the main collector lines.

The fact that the fingers are ultra-thin can result in the interruption of such fingers.

Another main disadvantage of the ultra-thin screens is their higher cost and lower durability and/or reliability.

An alternative technique to the standard screen printing is the application of an etched or electroformed metal mask. The manufacturing process of such mask involves etching of a cavity pattern on the one side of the metal foil and a mesh pattern on the reverse side. Photoresist masking and precise mask positioning are necessary for double-sided etching of the metal foil. This implies a complicated design and a very high screen cost.

In the case of conventional wire mesh screens as well as in the case of the metal etched screens, the open area (mesh openings) is usually not higher than 50% of the pattern. The open area defines the maximum amount of paste transferred to the substrates and at the same time the wet line thickness. Another important point is that a small mesh aperture requires utilization of special inks formulated for fine line printing. This is in conflict with most of the commercially available silver pastes for solar cell front contact metallization. Silver powder has a tendency to create agglomerates of particles in the paste. In addition, a flake-shaped silver powder, usually used in the paste formulation for a solar metallization, increases the tendencies to create agglomerates of particles in the paste.

The modern solar cell processing includes growing of thin thermal oxide (50–250 Å) on the top emitter surface using methods well known in microelectronics. Such an oxide layer passivates defects and recombination centers always present on the semiconductor surface. This process leads to an improvement of cell response to solar short wavelength radiation that in effect gives rise to a higher cell efficiency. Although commercially available screen printed pastes produce good contact to non-oxidized silicon surfaces, the firing through thermal oxide gives difficulties in obtaining high quality contacts with low resistance.

It should also be noted that the solar cell manufacturing process incudes in most cases a step of applying an antireflection (AR) coating which can be deposited before or after the contact formation. If the AR layer is deposited before contact printing, it often gives rise to the problem of high contact resistance between silicon and printed contacts. This problem occurs particularly when silicon nitride is used as an antireflection coating.

If an AR layer is deposited after the contact formation, another problem is raised which is the soldering of the collector lines during the module fabrication.

The solution to this problem brings the "firing through" method described in PCT Document WO 89/12312, wherein the authors apply the commercially available silver paste "Ferro #3349" to "fire through" a silicon nitride ARC. A "fired through" TiO$_2$ AR layer is described in the paper by Nunoi, et al. "High performance BSF silicon solar cell with fired through contacts printed on AR coating", 14th IEEE PV Specialists Conference—1980, San Diego, USA, pp. 805–810.

PCT Document WO 92/22928 describes a solar cell and a method to make it wherein an antireflective coating is deposited on a semiconductor substrate before a first set of narrow elongated parallel electrodes are printed thereon and wherein finally a second set of elongated electrodes are affixed to each of the first electrodes.

It should be noted that the paste or the ink used in order to form the array of narrow elongated parallel electrodes is such that it penetrates said antireflective material and forms mechanically adherent and low electrical resistance contact with the front surface of the semiconductor substrate. This means that not all the conventional pastes can be used. Furthermore, in order to have such good contact between the semiconductor substrate and the narrow elongated parallel electrodes, a step of "firing through" is necessary.

The firing at the same time through the thermally grown silicon dioxide and antireflection coating (particularly silicon nitride) layers, although described in the technical literature, usually gives problems of high contact resistance and is difficult to achieve with commercial pastes.

E.P.O. Document EP-A-0002550 describes a method of forming a contact configuration for soldering a metal connection on a region of the surface of a semiconductor body comprising the provision by serigraphy, on at least a part of said region, of a conductive paste which comprises at least a principal metal, said paste then being vitrified thermally such that the dopant migrates into at least a surface part on the region of a surface of the semiconductor body.

OBJECTS OF THE INVENTION

The present invention has as an object to provide improved semiconductor devices such as solar cells which do not have the drawbacks of the prior art.

More particularly, the present invention aims to form semiconductor devices such as solar cells wherein the electrical contacts exhibit a low series of resistance and a low metal coverage which also provides a low front surface shadowing.

Many other advantages will be mentioned hereunder in the description of the main characteristics of the present invention.

SUMMARY OF THE INVENTION

The present invention provides a method of forming the top contact pattern of a solar cell, which consists of a set of parallel narrow finger lines and wide collector lines deposited essentially at the right angles to the finger lines on a semiconductor substrate, characterized in that it comprises the following steps:

(a) screen printing and drying the set of narrow finger lines;

(b) printing and drying the wide collector lines on top of the set of finger lines in a subsequent step;

(c) firing both finger lines and collector lines in a single final step in order to form an ohmic contact between the finger lines and the semiconductor substrate and between the finger lines and the wide collector lines.

According to a first preferred embodiment, the following steps are performed before the screen printing step of the contact finger lines:

(1) screen printing a pattern of masking paste on the front surface of the semiconductor substrate, so that the printed pattern will form the pattern for the set of parallel finger lines;

(2) depositing an antireflection coating over the whole front surface;

(3) dissolving the masking paste and selectively lifting-off the portions of the antireflection coating which have been deposited on the masking paste;

(4) etching-off the oxide layers from the openings in the antireflection coating;

(5) performing the steps (a), (b), and (c) as described hereabove.

According to another possible embodiment of the present invention, an antireflection coating is deposited in an intermediate step after printing and drying the front contact finger lines and before the collector lines are printed and dried.

The several methods described hereabove can be applied to substrates already having a rear ohmic contact or a back contact can be formed during the front contact formation or after the front contact has been already fabricated.

It should be noted that according to the method of the present invention, the last step is only a co-firing step and not a step of firing through.

The screen for printing the set of narrow parallel finger lines is preferably made from a solid metal foil in which the set of parallel lines which form the finger contact pattern can be chemically etched or cut by a laser or an electron beam.

However, in some particular embodiments wherein bridges over the openings are allowed, other masks besides metal stencils can be used, such as a mesh screen.

The screen used for printing the collector lines is preferably made of a conventional mesh screen or a metal stencil screen.

Other techniques such as ink-jet printing or off-set printing can also be used in the present invention for printing the collector lines. The proposed invention results in many advantages over using conventional screen printing techniques.

Concerning Finger Lines

1. The pattern of parallel finger lines is formed in a solid metal foil which means that it has an open area equal to 100%. No meshes are present in the pattern openings. This increases the volume of the paste transferred to the substrate in the printing process. It should be noted that when using a standard wire mesh screen, the open area is only between 40%–60%.

2. The absence of the meshes in the openings reduces the requirements for good screen printability of pastes used for front contact printing. Pastes with a high solids content and high viscosity can be used.

3. Using a laser or an electron or ion beam for metal mask cutting gives the possibility of obtaining pattern definition down to a few micrometers. This depends on the metal foil thickness and the quality of the cutting system. In practice, the line width is limited by the requirement of high line thickness. The thicker the metal mask the higher is the thickness of the printed lines. On the other hand, the ratio of the cut line width to the mask thickness should be above 0.5. A lower ratio leads to difficulties in paste transfer through the mask openings during printing. It has been demonstrated that laser cutting can fabricate a finger pattern of 30 µm wide lines cut in a 50–60 µm thick stainless steel foil.

The result of the above advantages 1–3 gives the possibility of printing very narrow lines with a high aspect ratio and no interruptions. Lines with width of 40 µm and up to 25–30 µm thickness have been measured after printing and drying. This corresponds to 13–16 µm thick lines after firing. A metal sheet resistance of 1–2 mohm/sq. was measured with most commercially available specialized pastes for solar cell front contacts.

4. Furthermore, using solid stainless steel stencils instead of wire mesh screens for printing the finger lines increases the durability of the screens.

5. Cutting the continuous and completely open lines by a laser or electron beam simplifies the screen fabrication process and strongly decreases the screen cost.

Concerning Collector Lines

1. A collector pattern is preferably prepared with a conventional wire mesh screen or with solid metal masks. A durable screen with a total (screen+emulsion) thickness above 100 µm can be used. A standard screen with a mesh density of 200 or 180 per inch covered with a 20 µm thick emulsion is typical for collector printing.

2. The thick collector lines with a sheet resistance below 1 mohm/sq. will be easily obtained with most of the silver pastes for front contact metallization. The width of the collector lines can be decreased, giving lower shading. Using the preferred embodiment of the present invention wherein prior to the screen printing of the finger lines, a screen printing of a masking paste is performed with the deposition of antireflection coating, the following advantages can be noted:

Concerning the Masking Paste

The role of the masking paste is to provide a selective mask for an antireflection coating (ARC) deposition at those regions of oxidized silicon substrates where the front contact finger lines are going to be printed. The masking paste after the drying or curing process should stay intact during the ARC deposition and be easily removed, later lifting off of the ARC layer deposited on top of it. Pastes containing fine metal powders or powders of silicon oxide, titanium oxide, or chalk powder mixed with an organic vehicle fulfill the task. These pastes are easily removed in organic solvents.

Concerning the Front Finger Contact Paste

Since there is no intermediate layer between the printed front finger contact and silicon substrate and since the applied laser cut stencil screens have no blocking meshes, the requirements for the front contact silver pastes specialized for the front contact formation can be applied in the present invention.

Concerning the Front Collector Paste

The paste applied for the collector lines can be the same silver paste as for the front fingers or any other high conductivity paste which gives a good adherence to an antireflection coating layer, does not penetrate completely through the ARC, and provides a perfect low resistance ohmic contact to finger lines.

Furthermore, in the case when an antireflection coating is used, the following advantage could be mentioned:

1. Both finger and collector lines are co-fired in the same firing process. As a result, the finger lines are in good electrical contact with the substrate, and the collector lines are in good electrical contact with the finger lines. In any case, the collector lines are not covered by an ARC layer. This gives no problem with soldering of collector lines during module fabrication.

2. Separation of the collector lines from the direct contact with silicon substrate reduces carrier recombination losses existing at the metal contact-silicon interface. Selection of material used for the ARC coating and of the deposition technique are crucial for achieving a separation. Most top contact silver pastes penetrate through an ARC layer of titanium dioxide deposited by Atmospheric Pressure Chemical Vapor Deposition (APCVD). In the case of using a silicon nitride AR layer deposited by Plasma Enhanced CVD, such ARC layer can be a very good barrier between silicon and most screen printed silver pastes.

3. Solar cell contacts prepared according to the present invention can have contact finger lines placed much more closely without additional shadowing. Solar cells with lightly doped emitter and a higher sheet resistance can be fabricated by a screen printing solar cell process, which results in an improvement of solar cell response to short wavelength light.

Accordingly, the solar cells having electrical contacts prepared with the method according to the present invention exhibit:

low sheet resistance of fingers;

lower sheet resistance of collectors;

lower contact resistance of finger/substrate interface;

lower series resistance of solar cell;

lower shadowing losses caused by fingers;

lower shadowing losses caused by collector lines;

lower solar cell total shadowing losses;

lower carrier recombination losses at contact-silicon interfaces.

BRIEF DESCRIPTION OF THE DRAWINGS

The present invention will be described using a solar cell contact pattern as an example, presented in the drawings wherein.

DETAILED DESCRIPTION OF THE PRESENT INVENTION

I. Preparation of Screens

1. A standard fabric screen is stretched and glued to a frame adequate to the screen printer used. Typical parameters are metal screen of 80 UT, orientation of wires to the frame at an angle of 90°, and tension of the screen 30N.

2. An emulsion typical for screen patterning is deposited over the screen and dried.

3. A solid metal foil with thickness of 40–60 µm is bonded at its peripheries to the standard fabric screen stretched to the frame. The meshes of the fabric screen are cut away from the middle region of the foil where the pattern will be formed.

4. A set of parallel lines reflecting the finger pattern of solar cell contacts is cut by a laser beam. An electron or ion beam can also be used for the cutting process. The width of the cut lines is regulated by the beam diameter, the power, and the cutting speed. A typical contact finger screen consists of lines with width of 40–50 µm and a distance between them of 1.2–1.5 mm cut in a stainless steel foil with a thickness of 50–60 µm. The area of finger lines is between 3% and 4% of the total top surface.

5. The collector lines screen is prepared by standard techniques using a wire mesh screen or by laser cutting of a metal foil. A standard screen with a mesh density of 165 is typical for this application. The metal foil bonded to a fabric screen as described in I.1 is used for the preparation of a laser cut screen. Typical collector line width is between 1–1.5 mm.

Other techniques such as ink-jet printing or off-set printing can be used in the present invention for printing the collector lines.

II. Description of the Manufacturing Processes of Solar Cells

Figure 3A:
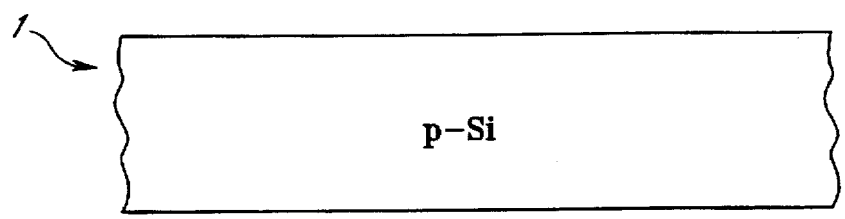
FIGS. 3a-3i show the steps of an entire manufacturing process of a solar cell for one preferred embodiment of the invention.

The starting material which is represented in FIG. 3a as an "as cut" Cz monocrystalline or multicrystalline silicon substrate (1) and is subjected to the following preliminary steps:

1. Saw Damage Etching

Saw damage etching can be performed in an acid or caustic solution. Hot sodium hydroxide or potassium hydroxide is used more often for removal of a surface damaged layer. Typically a concentration of 20–30% NaOH solution in water and at a temperature of 90°–95° is used. A time of five minutes is sufficient to etch away 20 µm from each side of the wafer. This is followed by a thorough rinsing in DI water.

2. Texturing

Texturing is done according to the well known process used in solar cell technology:

a 2% weight solution of sodium hydroxide in 90% DI and 10% isopropanol volume solution is heated to a temperature of 75–80° C.

wafers are immersed in the solution for 15–30 minutes; rinsing in DI water.

3. Chemical Cleaning

Phosphorus diffusion is usually preceded by chemical cleaning. In the present case, it is dipped in a 4:1 solution of sulfuric acid and hydrogen peroxide, followed by rinsing in DI water. Next, the wafers are dipped in a 1% solution of hydrofluoric acid and rinsed in DI water. Other cleaning methods such as RCA-cleaning or rinsing in HCl solution can also be used.

Figure 3B:
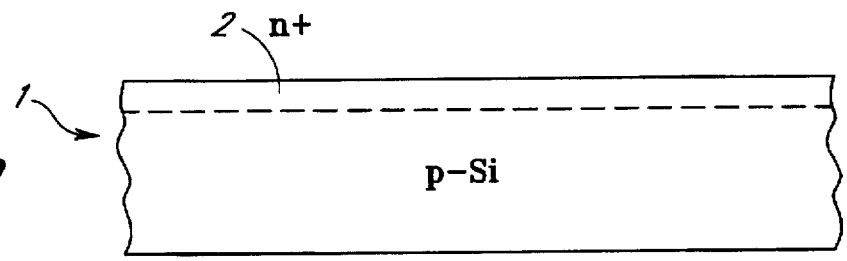

4. Phosphorus Diffusion (FIG. 3b)

Phosphorus diffusion can be done by any means known in microelectronics: gaseous source, or spin-on solution or screen printing of a phosphorus paste. More information concerning this step can be found in EP-B-0108065.

In the present embodiment, the diffusion is done by screen printing a phosphorus paste on the top substrate surface (1) in order to create an n+ layer (2). Diffusion was carried out in a conveyor belt furnace at a peak temperature of 910° C. Diffusion glass was removed by dipping the wafers in 10%–25% hydrofluoric acid for about 30 sec. The sheet resistance of the diffused layer is in the range of 45–50 ohm/sq.

Figure 3C:
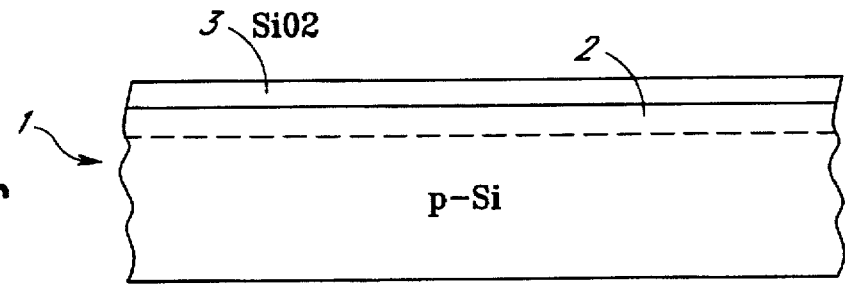

5. Dry Silicon Dioxide Growth (FIG. 3c)

The process of dry silicon dioxide growth is well known and widely described in microelectronics literature. The thin passivation layer (3) of silicon dioxide is usually grown in an open tube furnace in a dry oxygen atmosphere at a temperature in the range from 800° C. to 900° C. In the present embodiment, a temperature of 800° C. and time of 15 minutes is used for growing a 150 Å thick silicon dioxide layer (3).

Figure 3D:
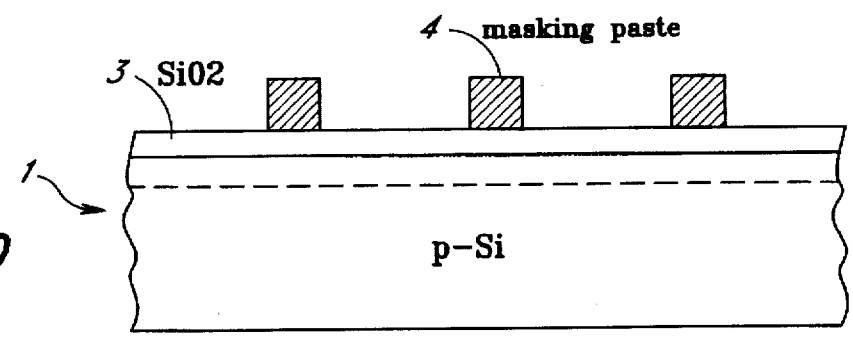

6. Masking Paste Printing and Drying (FIG. 3d)

Figure 2:
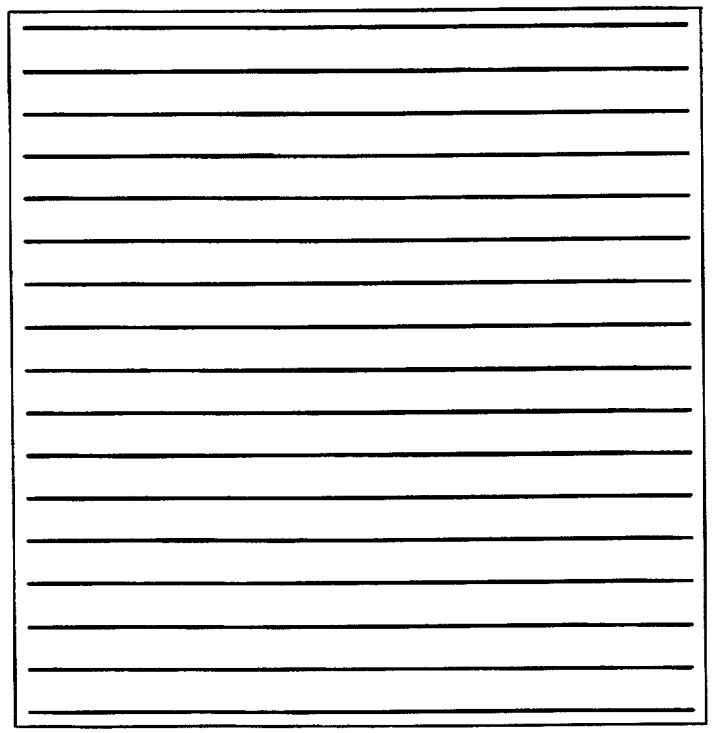
FIG. 2 is a schematic view of the top contact finger pattern obtained by a separation of finger printing from collector printing.

A front contact metal stencil screen with a finger pattern as shown in FIG. 2 is used for printing of a masking paste (4). The paste is subsequently dried at a temperature of around 100°–300° C. In this embodiment of the present invention, a paste comprising 60% wt. titanium dioxide powder and 40% wt. butyl carbitol is used.

Figure 3E:
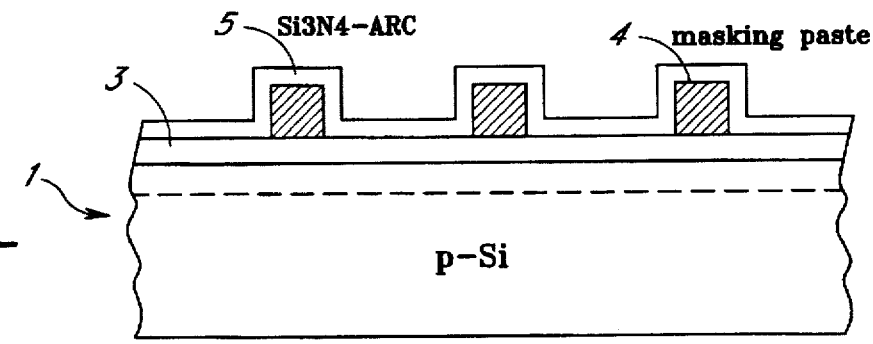

7. Antireflection Coating Deposition (FIG. 3e)

Antireflection coating (5) can be fabricated by means and use of any material known in microelectronics for antireflection coating deposition. However, the properties of the AR layer influence the next processing steps and solar cell characteristics. In this embodiment of the present invention PECVD silicon nitride is applied.

Figure 3F:
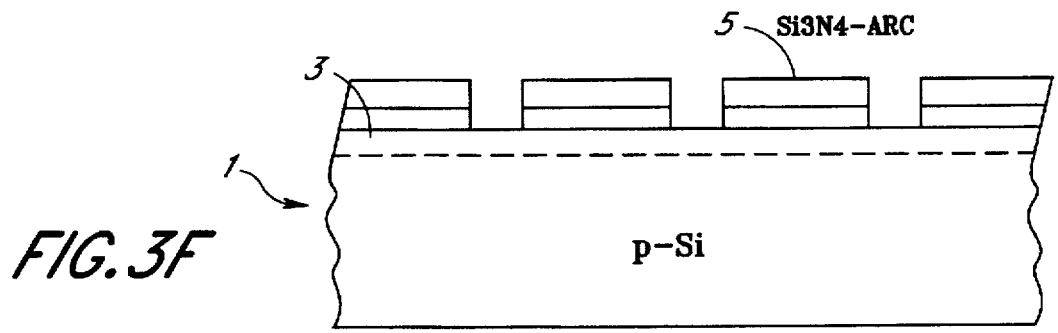

8. Masking Paste Removal and Selective ARC Lift-Off (FIG. 3f)

The substrates are then immersed in an organic solvent (isopropyl alcohol, acetone or butyl carbitol or others) which can dissolve the masking paste and leave the ARC layer intact. A solution of sulfuric acid (4 vol. parts) and hydrogen peroxide (1 vol. part) can also be used when the ARC is fabricated of silicon nitride. Dissolving the masking paste lifts-off the ARC layer deposited on its top and creates openings in the ARC layer. The ARC layer can be used now as a mask for a thermal oxide etching in the openings. This selectively uncovers the silicon surface in the areas where the front finger pattern will be printed. It should be mentioned, however, that if an applied paste fires through a thermal oxide, the etching step can be omitted.

Figure 3G:
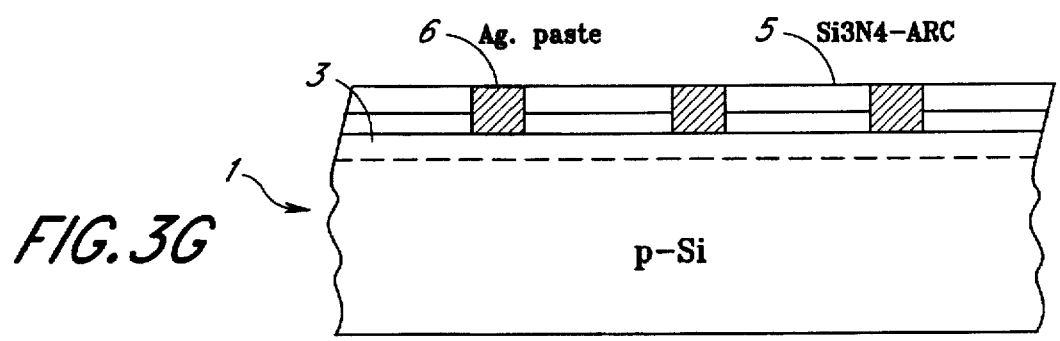

9. Printing and Drying a Front Contact Finger Pattern (FIG. 3g)

A front metal stencil screen with the same finger pattern (6) as in step 6 is used for front contact screen printing. The silicon surface in the contact areas is not covered by any layer (oxide or ARC) so all problems related to a high contact resistance created by intermediate layers between screen printed metal layers and silicon are solved. As a result, any silver paste suitable for a solar cell front contact metallization can be applied. Modern screen printers equipped with an optical alignment system can be employed. The pattern printing is followed by drying in an IR-dryer at a temperature of 125° C.–150° C. A line width as low as 40 μm has been obtained.

Figure 3H:
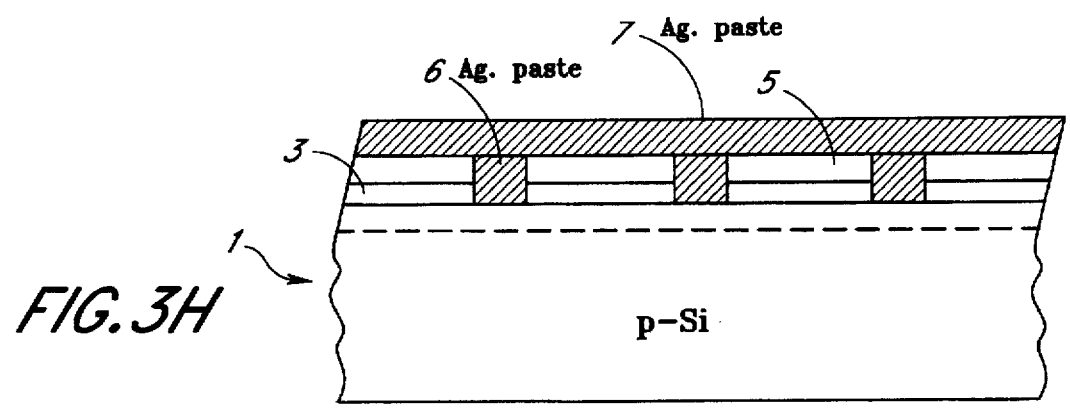

10. Top Contact Collector Printing and Drying (FIG. 3h)

Figure 1:
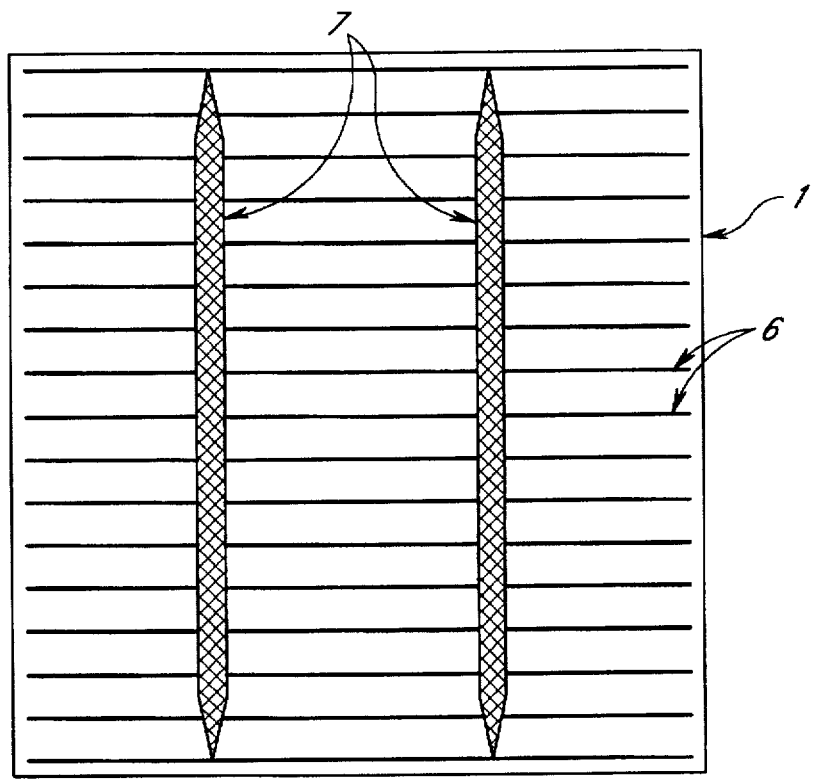
FIG. 1 is a schematic view of the top contact pattern containing both contact collector lines and contact finger lines.

Top contact collector lines (7) are printed and dried in a temperature range 125° C.–150° C. A thick standard mesh screen or stencil screen can be used which in effect gives the possibility of printing very thick collector lines with a low resistance. The complete top contact pattern as shown in FIG. 1 is obtained. The collector lines (7) are not covered by an ARC layer (5), which causes no problems in soldering during module fabrication. The paste used for collector line printing can be the same silver paste as for the front finger pattern or different.

Figure 3I:
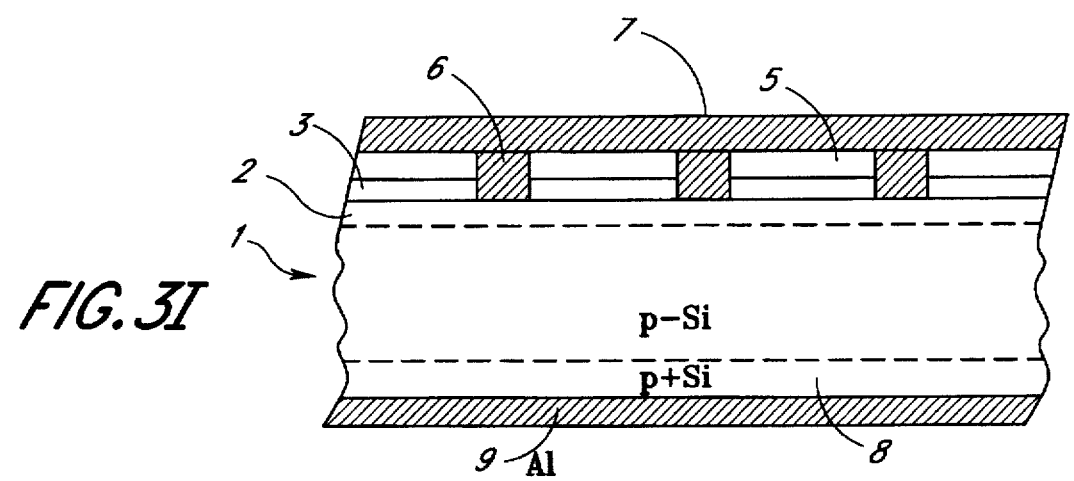

11. Back Contact Printing and Drying and All Contacts Firing (FIG. 3i)

A contact (9) is then formed on the back side of the wafer which is covered by silver-aluminum paste or aluminum paste with small apertures where silver paste slightly overlapping the adjacent aluminum layer can be later printed. The silver areas are used for tab attachment during module fabrication.

All pastes are co-fired in one step, preferably in an IR furnace. During the firing process silver finger lines (6) are sintered together with the n+ silicon surface, thereby creating a good electrical contact. At the same time, collector lines (7) and finger lines (6) are sintered together, also creating a good electrical contact. There are intermediate ARC (5) and SiO$_2$ (3) layers between the collector lines and silicon substrate (1). Depending upon which materials are used for the ARC and collectors lines, the collector lines are in contact with silicon or isolated. The best results are obtained where the pastes do not penetrate to the silicon surface. This reduces carrier recombination losses at the metal-silicon interface. A p$^+$ region (8) is formed in the silicon substrate adjacent the back contact (9) as a result of the firing process.

12. Edge Isolation

In the embodiment of the present invention, edge isolation is carried out by scribing and cleaving off the cell edges. There are many known techniques which can be also applied: plasma etching, chemical etching, laser scribing, etc.

We claim:

1. A method of preparing a contact pattern on a semiconductor substrate of a solar cell, said pattern comprising a set of narrow finger lines and wide collector lines that intersect and that are in electrical contact, said method comprising the steps of:

(1) screen printing a masking paste on top of a front surface of said semiconductor substrate using a screen with a pattern structure, thereby forming a printed pattern;

(2) depositing a coating over said front surface;

(3) dissolving said masking paste whereby selectively lifting-off the part of the coating deposited on top of the masking paste; thereafter (4) etching off oxide layers from areas of said front surface exposed through openings in the coating, wherein said openings are formed through the dissolving and lift-off step (3); and thereafter (5) screen printing the set of finger lines in said openings formed in said coating using a screen with said pattern structure and drying the set of finger lines.

2. The method of claim 1, wherein the step of depositing a coating over the front surface comprises depositing an antireflection layer.

3. The method of claim 1 further comprising the steps of:

printing and drying the collector lines on top of the set of finger lines; and firing both the finger lines and the collector lines.

4. The method of claim 1 further comprising the steps of:

subsequently, printing and drying the collector lines on top of the set of finger lines; and firing both the finger lines and the collector lines in a single final step.

5. The method of claim 4, wherein substrates already having a rear ohmic contact are used.

6. The method of claim 4, wherein said step of screen printing the set of finger lines comprises the use of a screen made of a solid metal mask.

7. The method of claim 6, wherein the set of finger lines and the collector lines are made with silver paste.

8. The method of claim 4, wherein the collector lines are printed by a process selected from the group consisting of screen printing, ink-jet printing, and off-set printing.

9. The method of claim 8 wherein the set of finger lines and the collector lines are made with silver paste.

10. The method as recited in claim 1 further comprising the steps of:

forming an oxide layer on top of said substrate thereby forming said front surface;

thereafter executing steps (1) to (3), etching of said oxide layer through openings in the coating;

and thereafter executing step (4).

11. The method of claim 1, wherein said masking paste comprises metal powders or powders of silicon oxide or powders of titanium oxide or chalk powder, mixed with an organic material.

12. The method of claim 1 wherein the step of dissolving the masking paste is executed by immersing said substrate in an organic solvent.

13. The method of claim 1, wherein the step of dissolving the masking paste is executed by immersing said substrate in a solution of sulfuric acid and hydrogen peroxide.

* * * * *